United States Patent [19]

Mills

[11] 4,129,826
[45] Dec. 12, 1978

[54] CIRCUIT TEST APPARATUS

[75] Inventor: Chester R. Mills, Woodbury, N.J.

[73] Assignee: RCA Corporation, New York, N.Y.

[21] Appl. No.: 827,241

[22] Filed: Aug. 24, 1977

[51] Int. Cl.$^2$ ............................................. G01R 27/00
[52] U.S. Cl. ................................. 324/57 SS; 324/64; 324/DIG. 1
[58] Field of Search ................... 324/57 SS, 57 R, 64, 324/DIG. 1

[56] References Cited

U.S. PATENT DOCUMENTS

| | | | |
|---|---|---|---|
| 2,870,430 | 1/1959 | Hancock | 324/57 R X |
| 2,951,200 | 8/1960 | Critchlow | 324/57 SS |
| 2,991,436 | 7/1961 | Banton | 324/57 SS X |
| 3,457,507 | 7/1969 | Overtveld | 324/57 R X |
| 3,464,007 | 8/1969 | Williams | 324/64 |

Primary Examiner—Stanley T. Krawczewicz
Attorney, Agent, or Firm—H. Christoffersen; Samuel Cohen; William Squire

[57] ABSTRACT

A fixed amplitude test waveform is concurrently applied to a reference circuit and a circuit under test that is supposed to be substantially identical to the reference circuit. The waveform comprises a composite signal whose frequency varies through a range of values during each period and is produced by a generator whose effective impedance also varies in accordance with the variation in frequency. The voltages developed at the test points of the reference and test circuits are compared and the difference between them, which is a measure of an undesired condition of the test circuit, is displayed.

8 Claims, 1 Drawing Figure

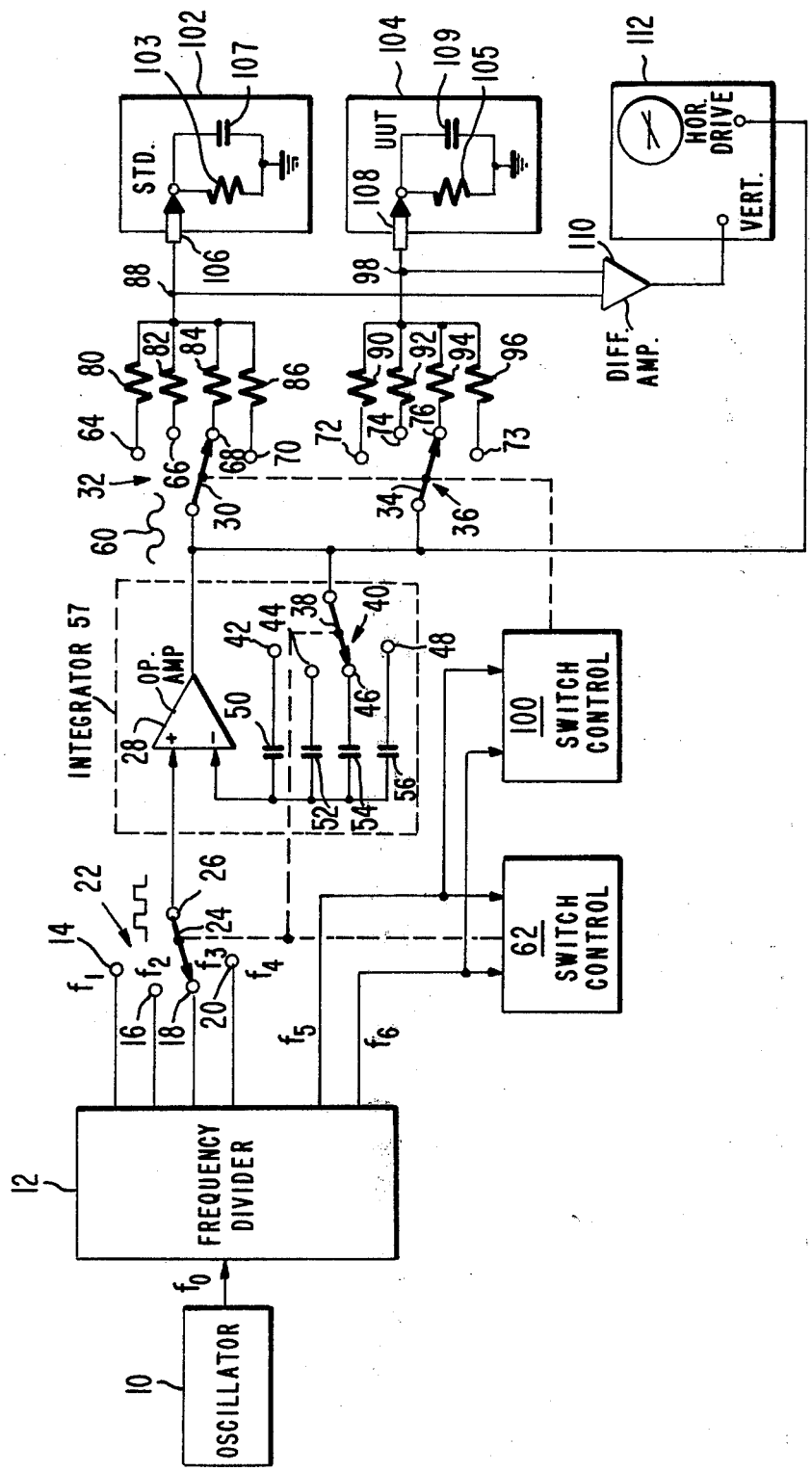

CIRCUIT TEST APPARATUS

The present invention relates to test apparatus for comparing a known circuit to an unknown circuit. Circuit test apparatus for comparing a known circuit to an unknown circuit are in wide use. Generally, these testing circuits supply a known signal in accordance with the operating characteristic of a given circuit to the input of that circuit. That circuit then processes the signal in a desired manner. That is, the output of the circuit in response to the supplied input signal has certain expected characteristics. This output signal of the circuit under test is compared with a signal generated synthetically or to the output of a standard circuit which has an identical input signal applied thereto. These types of testing circuits do not have universal application but must be established for a given circuit configuration to be tested. Such test apparatus can be relatively complex and costly.

In accordance with the present invention, a circuit test apparatus compares a known circuit to a reference circuit by applying a test signal to any desired circuit location without destructive failure of any of the circuit components. The test apparatus is relatively easy to use and provides rapid fault information. The apparatus generates a test waveform comprising a composite signal whose frequency varies through a range of values during each period and is produced by a generator whose effective impedance varies in correspondence with the variations in frequency. The voltages developed at the test point of the reference and test circuits are compared and the difference between them, which is a measure of an undesirable condition of the test circuit, is developed.

The sole drawing is a schematic diagram of a circuit embodying the present invention.

In the drawing, oscillator 10 provides a square wave signal having a relatively high frequency $f_o$. This signal is applied to the frequency divider 12 which derives from this signal a plurality of square wave signals $f_1-f_6$, each at a different frequency which is a fraction of the frequency $f_o$. Signals $f_1-f_4$ are applied to terminals 14, 16, 18 and 20, respectively, of switch 22, these terminals being engagable by wiper 24. In practice, the switch 24 (and the other switches) may be electronic switches; however, they are shown as mechanical devices for ease of explanation. Wiper 24 is connected as one input to operational amplifier 28 through terminal 26. Wiper 24, which is continuously rotated, selectively connects each of terminals 14-20 to terminal 26 in a repeating sequence. The output of operational amplifier 28 is applied to wiper 30 of switch 32, wiper 34 of switch 36 and wiper 38 of switch 40. The other input of operational amplifier 28 is connected to switch terminals 42, 44, 46 and 48 through respective capacitances 50, 52, 54 and 56 of different values. The wiper 38, which rotates in synchronism with wiper 24, contacts the terminals 42-48 in the same sequence as wiper 42 contacts its terminal 14-20.

The operational amplifier 28 and its feedback circuit form integrator 57. This integrator 57 transforms the square wave signal it receives at terminal 26 into an approximation of a sinusoidal signal 60. By way of example, signal $f_0$ can be 82kHz, signal $f_1$ can be 5120Hz, $f_2$ can be 640Hz, $f_3$ can be 80Hz, and $f_4$ can be 20Hz and the corresponding capacitances may have values of 50 (for $f_1$)=750 picofarads (pF), 52 (for $f_2$)=6000pF, 54 (for $f_3$)=47,000pF and 56 (for $f_4$)=200,000pF.

Switch control 62 operates in response to signals $f_5$ and $f_6$ generated by divider 12 for switching the wipers 24 and 38 in unison. This switching control is represented by the dashed lines.

The wiper 24, in the position illustrated, contacts terminal 18 so that signal $f_3$ is applied to the operational amplifier 28. During the same time interval, wiper 38 connects the output of amplifier 28 to the other input of amplifier 28 via capacitance 54.

Switch control 62 preferably is formed with microcircuits on an integrated circuit chip. Signals $f_5$ and $f_6$ are square wave signals which may be at frequencies of 10Hz and 5Hz. Switch control 62 derives switch control signals from these two input signals for operating the wipers 24 and 38. The wiper 24 represents an electronic device operated by a two-by-four encoded signal derived from the signals $f_5$ and $f_6$. That is, a binary two bit signal provides four encoded states. For example the derived signal may have codes 00, 01, 10 and 11. Each code represents a switch connection to a different one of terminals 14, 16, 18 and 20. Such electronic switching devices are commercially available and, for example, may be an RCA CD 4052A.

Preferably, the highest of frequencies $f_5$ and $f_6$, e.g., 10Hz, is about one-half of the lowest of frequencies $f_1-f_4$, e.g., 20Hz, signal $f_4$. This permits at least one cycle of the signal 60 to be produced at the lowest frequency. While at least one cycle is preferred, signal 60 may be effective with less than one complete cycle.

The wipers 30 and 34 operate in phase and concurrently with the wipers 38 and 24. Wiper 30 is selectively connected to contact the terminals 64, 66, 68 and 70 and wiper 34 is selectively connected to contact terminals 72, 74, 76 and 78. The terminals 64-70 are each connected through corresponding resistances 80, 82, 84 and 86 to common terminal 88. The resistances 80, 82, 84 and 86 thus are sequentially connected between switch 32 wiper 30 and terminal 88. The terminals 72-78 are each connected through corresponding resistances 90, 92, 94 and 96 to common terminal 98. Thus, the resistances 90-96 are connected concurrently in the same sequence between the switch 36, wiper 34 and the terminal 98 as resistances 80-86 to switch 32. Only one of the resistances 80-86 is connected to the wiper 30 at any one time. In similar fashion, only one of the resistance 90-96 is connected to the wiper 34 at any one time. The corresponding resistors in the two banks are of substantially equal value. By way of example, resistance 80 and 90 may be 220k ohms. Resistances 82 and 92 may be 22k ohms. The resistances 84 and 94 may be 2200 ohms and resistances 86 and 96 may be 100 ohms. Thus the relatively high frequency signal $f_1$ is applied through a relatively high impedance resistances 80 and 90 while the relatively low frequency signal $f_4$ is applied to relatively low impedance resistances 86 and 96.

Wipers 30 and 34 are operated by switch control 100, which control is represented by the dashed line. Switch control 100 is identical to switch control 62 and receives two input control signals $f_5$ and $f_6$. Switches 32 and 36 also, in the alternative, may be electronic switches operated by the same binary encoded signal generated by a single control. The code may be the same as described above in connection with the control 62.

Wipers 30, 24, 34 and 38 are operated by switch controls 62 and 100 in ganged fashion such that when the wiper 30 contacts terminal 64, wiper 34 contacts terminal 72, wiper 38 contacts terminal 42 and wiper 24 contacts terminal 14. The wipers sequentially contact each of the terminals of their corresponding switch assemblies in synchronism continuously. In this embodiment the wipers are switched through all of the terminals at 5Hz or five cycles each second.

Thus, the signal 60 is a composite signal whose frequency varies during successive time intervals of each period from $f_1$ to $f_2$ to $f_3$ to $f_4$ in correspondence with the rotation of the wipers through the four switch positions. The signal 60 is continuous since there is substantially negligible delay time between the connection of each of the switch terminals to the wipers. The identical signal 60 appears on each of the wipers 30 and 34.

Common terminal 88 is connected to circuit probe 106 and common terminal 98 is connected to circuit probe 108. The standard circuit 102 and the unit under test (UUT) 104 are each represented by the parallel combination of a resistance and capacitance connected between the test point and ground. These circuits may also include inductive components to ground (not shown). Terminals 88 and 98 are connected as separate inputs to differential amplifier 110. The output of amplifier 110 is supplied as an input to the vertical drive of oscilloscope 112. The output of operational amplifier 28, signal 60, is applied to the horizontal drive of oscilloscope 112. The differential amplifier 110 may be included in the internal circuitry of the oscilloscope 112 and is available in present commercial oscilloscopes.

The resistances 80-86 and 90-96 are of significance in the present system. At any particular time, a resistance from bank 80-86 and a resistance from bank 90-96 together form two arms of a bridge, and the impedances between the test point and ground of the standard unit and the unit under test (UUT), respectively, form the other two arms of the bridge. In the position illustrated of the circuit, resistors 84 and 94 form the two known bridge arms, the known parallel combination of resistors 103 and capacitor 107 form the third bridge arm, and the parallel combination of resistor 105 and capacitor 109 form the fourth bridge arm. The differential amplifier 110 is connected between the nodes 88 and 98 of the bridge. Elements 84 and 94 are of the same value and if the impedance of the standard unit (STD) between node 88 and ground is equal to that of the UUT between node 98 and ground, the bridge is in balance and the output of amplifier 110 is zero.

It is important in the operation of the bridge that there be available, for any impedance in the UUT it is desired to test, a value of impedance in roughly the same range for the reference arms (the resistors in banks 80-84 and 90-96) of the bridge. This is to obtain optimum sensitivity from the bridge (comparable to the use of different ranges in an ohmmeter). Thus, if say the impedance in the UUT which is being measured is purely resistive and is say in the range of 100k ohms, then the present test set will provide a good "reading" of this impedance when the reference arms of the bridge consist of resistors 80 and 90, each having a value of 200k ohms. That is, when these two resistors are in the circuit, a relatively small difference in value between the impedance in the UUT and that in the STD will unbalance the bridge and result in an easily detectable reading on the test oscilloscope 112. At other positions of the switches where the reference arms differ very greatly in value from the impedances (resistances only in this example) being measured, the bridge is much less sensitive. For example if in the UUT the resistance being measured is 100k ohms and the reference arms are 86 and 96 (100 ohms each), the bridge will be insensitive to small differences between the values of the resistances in the STD and the UUT. The values of resistance given by way of example have been found to provide good performance over a large range of impedances in the UUT it is desired to test for. The electronic switches forming controls 62 and 100, add in practice, about 100 ohms to the circuit. This does not adversely affect the performance of the circuit.

In the discussion above, it is assumed that only resistance is being tested for, however, in practice the STD and UUT bridge arms are more complex. For example, the impedance of each arm may be in the form of a resistive and a reactive component, where the latter may have a value $X_c = (1/2\pi FC)$, where C is the value of the capacitance, such as 109, and F the value of the applied frequency. It is for this reason that in the present system it is not only the impedance of the reference arms of the bridge that is varied through a range of values but also the frequency is varied. As the impedance $X_c$ increases with a decrease in capacitance, the optimum bridge configuration is such that small values of the capacitance are best tested with reference bridge arms which have large values of resistance and with the testing being carried out at higher frequency (the higher frequency causes the capacitive reactance $X_c$ to be smaller). For example, a capacitance of say a nominal value 100 picofarads in the UUT would be sensed best in the present circuit with resistors 80 and 82 (200k ohms each) in the circuit and with frequency $f_1 = $ 5120Hz. Assuming resistors 103 and 105 to be present and to be say 1 or 2 Megohms or more, with the numbers given the reference arm impedances, 200k ohms each, is in the same general range as the STD and UUT bridge arm impedance and small differences between these latter two impedances will easily be detected by the circuit. Similarly, with small values of mainly reactive capacitive reactance in STD and UUT, the bridge works optimally with the reference arms at lower values of resistance and with the frequency also lower.

The value of frequencies $f_1$ and $f_4$ at the high and low end of the range were chosen empirically. It is found, in practice, that if $f_1$ and resistance 80 are made too high, then the circuit is too sensitive and slight, relatively insignificant differences in capacitances, produced even by differences in lead lengths, produce error signals. The lowest frequency, on the other hand, must result in a readable fault signal. If the frequency is made significantly lower than 20Hz, then flutter is introduced on the oscilloscope 112 display, interfering with the reading. If other indicators are used instead, and if flutter is not a problem with such indicators, then lower frequencies can be used.

The value of the frequencies of signals $f_2$ and $f_3$ is arbitrarily chosen within the range of the extreme frequencies of signals $f_1$ and $f_4$. The value of resistances 82, 84 and 92 and 94 are chosen to correspond to these frequency values. While four frequencies are employed in the present system and provide good performance, more or fewer than four frequencies could be used.

In operation, switch controls 62 and 100 automatically switch wipers 24, 38, 30 and 34 in a given sequence to each of the switch contact terminals, repeating the switching action continuously. This action produces a continuous sinusoidal signal 60 at the frequencies of signals $f_1$, $f_2$, $f_3$ and $f_4$. This signal is concurrently applied through the corresponding resistances 80 and 90, 82 and 92, 84 and 94 and 86 and 96 in sequence. Thus, identical signals are applied by the probes 106 and 108 to the assumed identical standard and circuit under test 102 and 104, respectively. The signals are applied anywhere to the circuits at identical corresponding locations.

Due to the impedance to ground produced by the various components in the circuits under test and the standard circuits, the voltages appearing at common terminals 88 and 98 should be identical if the components are, in fact, identical. If this is the case then differential amplifier 110 will produce a signal at zero volts resulting in a horizontal line on the oscilloscope display. Should one of the components in the unit under test have an incorrect value or be a short circuit, or the component be placed incorrectly in the circuit, then the voltages appearing between the terminal 88 and ground and terminal 98 and ground will differ. This difference is produced as an output from amplifier 110 which produces a signal on the display of oscilloscope 112 other than a horizontal straight line.

Since the signals $f_1-f_4$ are derived from the same square wave signal source, these signals each have about the same amplitude. There may be slight variations in amplitude, but integrator 57 smooths these variations. Thus, no high frequency switching transients are produced. If the amplitudes were different, then at the times of switching between the $f_1-f_4$ signals, the difference in amplitudes would result in the generation of a high frequency spike. This spike would be passed on to the circuits under test. The capacitive components 107 and 109 would generate a difference voltage due to their sensitivity at these high frequencies. This difference voltage would appear as an erroneous fault condition on the display. Thus, by making the signals $f_1-f_4$ of the same fixed amplitude, erroneous transient signals are avoided.

Further, in accordance with a feature of the present invention, the voltage applied by the probes 106 and 108 has the value within a range which is safe to use with most integrated circuits, FET, transistors, and other semiconductor devices. This voltage is preferably 1.8 volts peak-to-peak, i.e., 0.9 volts positive and negative with respect to ground. This voltage generally can be applied to any point in most circuits, including integrated types, without destructive failure of components in that circuit.

The following are examples of the visual defects which can be observed. A reversed diode or a transistor installed incorrectly with the wrong polarity will appear as a horizontal line with several diagonally spaced tails at the ends of the horizontal line. An incorrect capacitance appears as a tilted ellipse, a solder short across a reactive component appears as a tilted loop, an incorrect resistance value appears as a tilted line, and an incorrect inductance appears as loops centered about a horizontal line. Other components or a combination thereof will have various combinations of these and other easily identifiable display curves. In the case of resistances, by merely removing the differential amplifier and applying the voltage at terminal 98 to the vertical input of oscilloscope 112, the incorrect resistance is displayed as a tilted line. The angle of the tilt of the straight line can be calibrated to provide an accurate reading of the resistance value.

Additional features can be provided (not shown) for increasing the versatility of the apparatus. For example, the input to switch control 62 and 100 can be connected to a signal source which cause switch controls 62 and 100 to produce only one of the four encoded binary codes that will place the wipers 24, 28, 34 and 30 in a given switch position. Further, the common terminals 88 and 98 may be connected through switching devices (not shown) to the probes 106 and 108 so that one of the probes is grounded and the other is active. This results in the oscilloscope 112 displaying the signal appearing only on the one circuit.

There has thus been described a test circuit for dynamically testing and comparing an unknown circuit with a standard circuit. The unkown circuit can be tested almost at any location within the circuit. Sealed integrated circuit chip devices provide suitable test points via the extending leads. Tests can be performed readily quickly by unskilled technicians and provide accurate rapid checks of complex circuits within a minimum of set-up time. The composite sinusoidal signal formed of contiguous signals of different frequencies in a continuous wave are applied through suitable resistances to standard and unknown circuits for generating two signals representing the condition of the two circuits at the point of test. By simply comparing the two signals and displaying the compared results for visual observation on a suitable display, circuits can be quickly analyzed. Further, set-up time is minimized in applying the test signal to a circuit under test.

What is claimed is:

1. Apparatus for testing a circuit which is intended to be substantially identical to a reference circuit comprising, in combination:
   means for generating a periodic test waveform each period of which comprises a signal which varies through the same range of frequencies and at an impedance level which changes as the frequency changes and which is proportional to the frequency;
   means for applying the test waveform both to the reference circuit and the circuit under test;
   means for comparing the voltages developed at corresponding test points in the reference circuit and the circuit under test in response to said test waveform; and
   means for indicating the difference between said voltages.

2. The apparatus of claim 1 wherein said means for generating includes oscillator means for generating a plurality of signals each having a separate, different frequency at a fixed amplitude, and combining means for forming said signals into said test waveform.

3. The apparatus of claim 2 wherein said combining means includes first switch means for applying each said plurality of signals to a common output thereof, impedance means having a plurality of values each corresponding to a different one of said plurality of signals and second switch means for connecting said impedance means to said common output.

4. The apparatus of claim 1 wherein said means for generating includes means for generating said waveform at a substantially fixed amplitude.

5. A test circuit comprising:
   first, second, third and fourth nodes;
   a bridge comprising a first arm connected between the first and second nodes, and a fourth arm connected between the fourth and first nodes, said first and fourth arms comprising resistive arms of equal value;

said second and third nodes serving as points between which a unit under test (UUT) may be connected, said UUT, when in place, serving as a second arm of said bridge;

said third and fourth nodes serving as points between which a standard unit (STD) may be connected, said STD, when in place, serving as the third arm of said bridge;

means for applying a periodic test signal between said first and third nodes which varies in frequency, during each period of said signal, over a range of frequencies;

means for concurrently varying the resistance of said first and said fourth arms of said bridge in correspondence with and in the same sense as the variation in frequency of said test signal, while maintaining the resistance of said first and second arms equal to one another; and means coupled between said second and said fourth nodes for sensing any differences in voltage between said nodes.

6. A circuit test apparatus for comparing a reference circuit to a circuit under test comprising:

first and second terminals adapted to be connected to a point of reference potential through said reference and test circuits, respectively;

means for applying a first sinusoidal signal having a given amplitude and a first repetition rate to said first and second terminals through corresponding like first impedances;

means for applying a second sinusoidal signal interleaved with said first signal and having said given amplitude and a second repetition rate different than said first rate to said first and second terminals through corresponding like second impedances different than said first impedances; and comparison means for comparing the signals appearing at said terminals.

7. A circuit test apparatus for comparing a known circuit to an unknown circuit comprising:

means for generating a substantially sinusoidal test wave which varies in frequency, in N discrete steps, over a range of values, during each period of said test wave and which is of substantially constant amplitude;

switch means;

first and second terminals, said known circuit adapted to be connected between said first terminal and a point of reference potential and said unknown circuit adapted to be connected between said second terminal and said point of reference potential;

a first plurality of N impedances each of different value, each connected in parallel between said switch means and said first terminal;

a second plurality of N impedances of the same respective values as said first plurality of impedances, each connected in parallel between said switch means and said second terminal;

control means operating said switch means for applying said test wave through said switch means to said impedances, in a repeating sequence, said switch means supplying said wave concurrently to an impedance in the first group and to the equal valued impedance in the second group, and the wave being applied to an impedance only during the time the frequency of the wave is at one discrete value, and then when the value of frequency changes to another discrete value, said control means operating said switch means so that it supplies the wave to another pair of impedances of equal value, the value of the impedance selected for receiving a particular frequency component of the wave being a function of the value of the frequency; and means connected to said terminals for sensing the difference in voltage developed between them.

8. The apparatus of claim 7 wherein said generating means includes:

an oscillator;

frequency divider means for forming a plurality of square waves at N different frequencies;

amplifier means and;

a plurality of N selectable feedback paths each related to a separate, different one of said frequencies each forming an integrator with said amplifier means;

said control means placing each feedback path in circuit with said amplifier means concurrently with the generation of the wave whose frequency is related to that feedback path for integrating each said square wave.

* * * * *